(12) United States Patent
Hosono

(10) Patent No.: US 7,669,154 B2
(45) Date of Patent: Feb. 23, 2010

(54) TIMING ANALYSIS METHOD, TIMING ANALYSIS PROGRAM, AND TIMING ANALYSIS TOOL

(75) Inventor: Toshikatsu Hosono, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 203 days.

(21) Appl. No.: 11/206,814

(22) Filed: Aug. 19, 2005

(65) Prior Publication Data

US 2006/0225014 A1    Oct. 5, 2006

(30) Foreign Application Priority Data

Mar. 29, 2005    (JP)    ............................. 2005-095766

(51) Int. Cl.
G06F 17/50 (2006.01)
G06F 9/45 (2006.01)
(52) U.S. Cl. ..................... 716/6; 716/5; 716/18; 703/2; 703/13; 703/14; 703/19
(58) Field of Classification Search ................. 716/5–6, 716/18; 703/2, 13–14, 19
See application file for complete search history.

(56) References Cited

U.S. PATENT DOCUMENTS

| | | | | |
|---|---|---|---|---|
| 7,219,320 B2* | 5/2007 | Kawano et al. | ................ | 716/6 |
| 2004/0167756 A1* | 8/2004 | Yonezawa | ...................... | 703/2 |
| 2004/0254776 A1* | 12/2004 | Andou | ........................ | 703/19 |
| 2005/0050499 A1* | 3/2005 | Matsumoto et al. | ............ | 716/6 |

FOREIGN PATENT DOCUMENTS

JP    2002-222232    8/2002

* cited by examiner

Primary Examiner—Thuan Do
Assistant Examiner—Nghia M Doan
(74) Attorney, Agent, or Firm—Staas & Halsey LLP

(57) ABSTRACT

This invention intends to provide timing analysis methods, timing analysis programs, and timing analysis tools for the purpose of performing timing verification in optimum conditions without any excessive variations by statistically dealing with variations in elemental devices forming a semiconductor integrated circuit. In order to verify a timing between two signals, a delay value of a signal propagating through a signal path selected as a candidate for timing analysis is obtained, and with respect to a random variation amount of the delay value, a random variation amount corresponding to the number of gate circuit stages forming the signal path is obtained. Then, based on the delay value and the random variation amount, a most severe variation amount between the two signals in a most severe operating condition is obtained, and based on the most severe variation amount, a respective individual variation coefficient is allocated for each gate circuit, thereby performing a timing analysis.

16 Claims, 10 Drawing Sheets

EXAMPLE OF CIRCUIT FOR APPLICATION OF FIRST EMBODIMENT

SIGNAL DELAY DISTRIBUTIONS IN SIGNAL PATH

MOST SEVERE OPERATING CONDITION (1)
(AT TIME OF SETUP OPERATION IN SLOWEST OPERATING CONDITION)

MOST SEVERE OPERATING CONDITION (2)
(AT TIME OF HOLD OPERATION IN SLOWEST OPERATING CONDITION)

MOST SEVERE OPERATING CONDITION (3)
(AT TIME OF SETUP OPERATION IN FASTEST OPERATING CONDITION)

MOST SEVERE OPERATING CONDITION (4)
(AT TIME OF HOLD OPERATION IN FASTEST OPERATING CONDITION)

FLOWCHART OF SECOND EMBODIMENT

CONCEPTUAL DIAGRAM ILLUSTRATING CALCULATION OF NUMBER OF VIRTUAL CIRCUIT STAGES $$\left( N = \frac{TC}{TG} = \frac{1/f}{TG} \right)$$

EXPLANATORY DIAGRAM ILLUSTRATING CALCULATIONS OF PROCESS VARIATION COEFFICIENTS FOR CASE OF MULTISTAGE CONNECTION

FIRST SEVERIZATION OPERATING CONDITION (1)
(AT TIME OF SETUP OPERATION)

FIRST SEVERIZATION OPERATING CONDITION (2)
(AT TIME OF HOLD OPERATION)

$$\begin{cases} Nd2 \fallingdotseq Nc\ 2 \\ t(Na2) \fallingdotseq t(Nc2) \end{cases}$$

TIMING ANALYSIS METHOD, TIMING ANALYSIS PROGRAM, AND TIMING ANALYSIS TOOL

CROSS-REFERENCE TO RELATED APPLICATIONS

This application is based upon and claims the benefit of priority from each of the prior Japanese Patent Application No. 2005-095766 filed on Mar. 29, 2005, the entire contents of which are incorporated herein by reference.

BACKGROUND OF THE INVENTION

1. Field of the Invention

This invention relates generally to timing verification of semiconductor integrated circuits. More specifically, it relates to timing verification capable of statistical processing of variations in semiconductor integrated circuits.

2. Description of the Related Art

The static timing analysis (STA) has conventionally been utilized for timing verification of a logical circuit composed of semiconductor integrated circuits, etc. More specifically, based on delays, respectively, assigned to elemental devices forming a circuit, timing verification of the operation of the circuit is conducted by means of such a static timing analysis (STA) method. Without necessity to prepare test patterns, verification is conducted by cumulation of delays of the respective elemental devices, etc. in a signal transmission path.

Generally, elemental devices in a semiconductor integrated circuit vary in characteristics, in other words it is required that such variations be taken into consideration when conducting a static timing analysis (STA). More specifically, delays of the elemental devices are each multiplied by the same coefficient for representation of a respective variation for each elemental device, and a static timing analysis (STA) is executed in order to verify whether it is possible or not for the semiconductor integrated circuit to operate properly against in-chip variations (for related information, see Japanese unexamined patent publication No. 2002-222232).

More specifically, if, when the manufacturing process is set to such a condition that (i) the circuit operates at low speed, (ii) the chip temperature is high and, in addition, (iii) the power supply voltage is low, this is defined as a worst condition. On the other hand, if, when the manufacturing process is set to such a condition that (i) the circuit operates at high speed, (ii) the chip temperature is low and, in addition, (iii) the power supply voltage is high, this is defined as a best condition. For each of the worst and best conditions, the setup time and hold time of an internal circuit are verified.

SUMMARY OF THE INVENTION

In accordance with the above-described prior art technique, delays of elemental devices are each multiplied by the same coefficient, thereby to represent a respective delay variation for each elemental device. In this conventional technique, however, variations are cumulated depending on the number of gate stages in a signal propagation path. To cope with this, timing verification has to be performed by making excessive allowance for operations with the increase in the number of gate stages. The reason for this is that: in-chip individual elemental devices vary in their characteristics according to the normal distribution; mutual variations tend to cancel each other; and with the increase in the number of stages, the degree of delay variation in a signal propagation path is lowered.

In the above-described prior art technique in which allowance for operations is secured excessively, timing verification is conducted in an extremely severe condition and problems therefore arise. It is impossible to perform accurate timing verification on semiconductor integrated circuits, therefore making it extremely difficult to design semiconductor integrated circuits which are required to operate at high speed.

Bearing in mind the problems with the above-described prior art technique, the invention was made. Accordingly, an object of the invention is to provide timing analysis methods, timing analysis programs, and timing analysis tools capable of conducting timing verification in optimum conditions without any excessive variations by statistically dealing with variations present in elemental devices forming a semiconductor integrated circuit.

In order to accomplish the above-described object, one aspect of the invention pertains to a timing analysis method and a timing analysis program for verification of the propagation timing of two signals between signal paths. This timing analysis method (timing analysis program) is characterized in that it comprises the steps of: (a) obtaining a delay value of a signal propagating through a signal path selected as a candidate for timing analysis; (b) obtaining, with respect to the delay value's random variation amount, a random variation amount corresponding to the number of gate circuit stages forming the signal path; (c) obtaining, based on the delay value and the random variation amount, a most severe variation amount between the two signals in a most severe operating condition; (d) obtaining a respective most severe variation coefficient for each of the signals by allocation of the most severe variation amount to the two signals according to the most severe operating condition; (e) allocating, based on the most severe variation coefficient, a respective individual variation coefficient for each of the gate circuits; and (f) performing, based on the individual variation coefficient, a timing analysis.

In the timing analysis method (timing analysis program) according to the one aspect of the invention, when verifying a timing between two signals, a delay value for a signal propagating through a signal path as a timing analysis candidate is obtained, and with respect to the delay value's random variation amount, a random variation amount corresponding to the number of gate circuit stages forming the signal path is obtained. Then, based on the delay value and the random variation amount, a most severe variation amount between the two signals in a most severe operating condition is obtained and, thereafter, based on the most severe variation amount, a respective individual variation coefficient is allocated for each gate circuit, thereby to perform a timing analysis.

In addition, one aspect of the invention pertains to a timing analysis tool to perform a verification of the propagation timing of two signals between signal paths. This timing analysis tool is characterized in that it comprises: (a) a delay arithmetic unit for obtaining a delay value of a signal propagating through a signal path selected as a candidate for timing analysis; (b) a random variation arithmetic unit for obtaining, with respect to the delay value's random variation amount, a random variation amount corresponding to the number of gate circuit stages forming the signal path; (c) a most severe variation amount arithmetic unit for obtaining, based on the delay value and the random variation amount, a most severe variation amount between the two signals in a most severe operating condition; (d) a most severe variation coefficient arithmetic unit for obtaining a respective most severe variation coefficient for each of the signals by allocation of the most severe variation amount to the two signals according to the most severe operating condition; (e) an individual variation coefficient allocation unit for allocating, based on the most severe variation coefficient, an individual variation coefficient for each of the gate circuits; and (f) an analysis unit for performing, based on the individual variation coefficient, a timing analysis.

In the timing analysis tool of the one aspect of the invention, when verifying a timing between two signals, the delay arithmetic unit finds a delay value of a signal propagating through a signal path as a timing analysis candidate, and the random variation arithmetic unit finds, with respect to the delay value's random variation amount, a random variation amount corresponding to the number of gate circuit stages forming the candidate signal path. And, the most severe variation amount arithmetic unit finds, based on the delay value and the random variation amount, a most severe variation amount between the two signals in a most severe operating condition, and the most severe variation coefficient arithmetic unit finds a respective most severe variation coefficient for each signal by allocation of the most severe variation amount to the two signals according to the most severe operating condition. Further, the individual variation coefficient allocation unit is configured to allocate, based on the most severe variation coefficient, an individual variation coefficient for each gate circuit. The analysis unit is configured to perform, based on the individual variation coefficient, a timing analysis.

By means of this, the delay random variation amount is considered to be normally distributed and statistical processing is carried out, so that there is no variation cumulation depending on the number of gate circuit stages in a signal propagation path. In addition, it is possible to take variations that are non random variation amounts into consideration by defining a most severe operating condition. Variation amounts in the timing analysis are obtained with high accuracy, and without necessity to excessively secure operating allowance in guaranteeing circuit operations, it is possible to conduct an optimum timing analysis.

In addition, another aspect of the invention pertains to a timing analysis method and a timing analysis program for verification of the propagation timing of two signals between signal paths. This timing analysis method (timing analysis program) is characterized in that it comprises the steps of: (a) estimating, from operating information, the number of virtual circuit stages of a signal path; (b) obtaining, with respect to a delay random variation, a random variation coefficient in a first severization operating condition according to a predetermined basic variation coefficient and the estimated number of virtual circuit stages; (c) obtaining, based on the random variation coefficient, a gate variation coefficient of a gate circuit forming the signal path in a second severization operating condition; and (d) performing, based on the gate variation coefficient, a timing analysis.

In the timing analysis method (timing analysis program) of the another aspect of the invention, when verifying a timing between two signals, the number of virtual circuit stages of a signal path is estimated from operating information; with respect to a delay random variation, a random variation coefficient in a first severization operating condition is obtained according to a predetermined basic variation coefficient and the estimated number of virtual circuit stages; based on the random variation coefficient, a gate variation coefficient of a gate circuit forming the signal path is obtained in a second severization operating condition; and a timing analysis is conducted.

In addition, another aspect of the invention pertains to a timing analysis tool to perform a verification of the propagation timing of two signals between signal paths. This timing analysis tool is characterized in that it comprises: (a) a virtual stage count arithmetic unit for estimating, from operating information, the number of virtual circuit stages of a signal path; (b) a random variation coefficient arithmetic unit for obtaining, with respect to a delay random variation, a random variation coefficient in a first severization operating condition according to a predetermined basic variation coefficient and the estimated number of virtual circuit stages; (c) a gate variation coefficient arithmetic unit for obtaining, based on the random variation coefficient, a gate variation coefficient of a gate circuit forming the signal path in a second severization operating condition; and (d) an analysis unit for performing, based on the gate variation coefficient, a timing analysis.

In the timing analysis tool of the another aspect of the invention, the virtual stage count arithmetic unit is configured to estimate, from operating information, the number of virtual circuit stages of a signal path; the random variation coefficient arithmetic unit is configured to find a random variation coefficient in a first severization operating condition according to a predetermined basic variation coefficient and the estimated number of virtual circuit stages; the gate variation coefficient arithmetic unit is configured to find, based on the random variation coefficient, a gate variation coefficient of a gate circuit forming the signal path in a second severization operating condition; and the analysis unit is configured to perform a timing analysis.

By means of this, when performing statistical processing on delay random variation amounts, information about individual signal paths and gate circuits forming a signal path is no longer required, thereby making it possible to conduct an optimum timing analysis in a short period of time.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

With reference to FIGS. 1 to 13, specific embodiments of timing analysis methods, timing analysis programs, and timing analysis tools in accordance with the invention will be described below in details.

Figure 1:
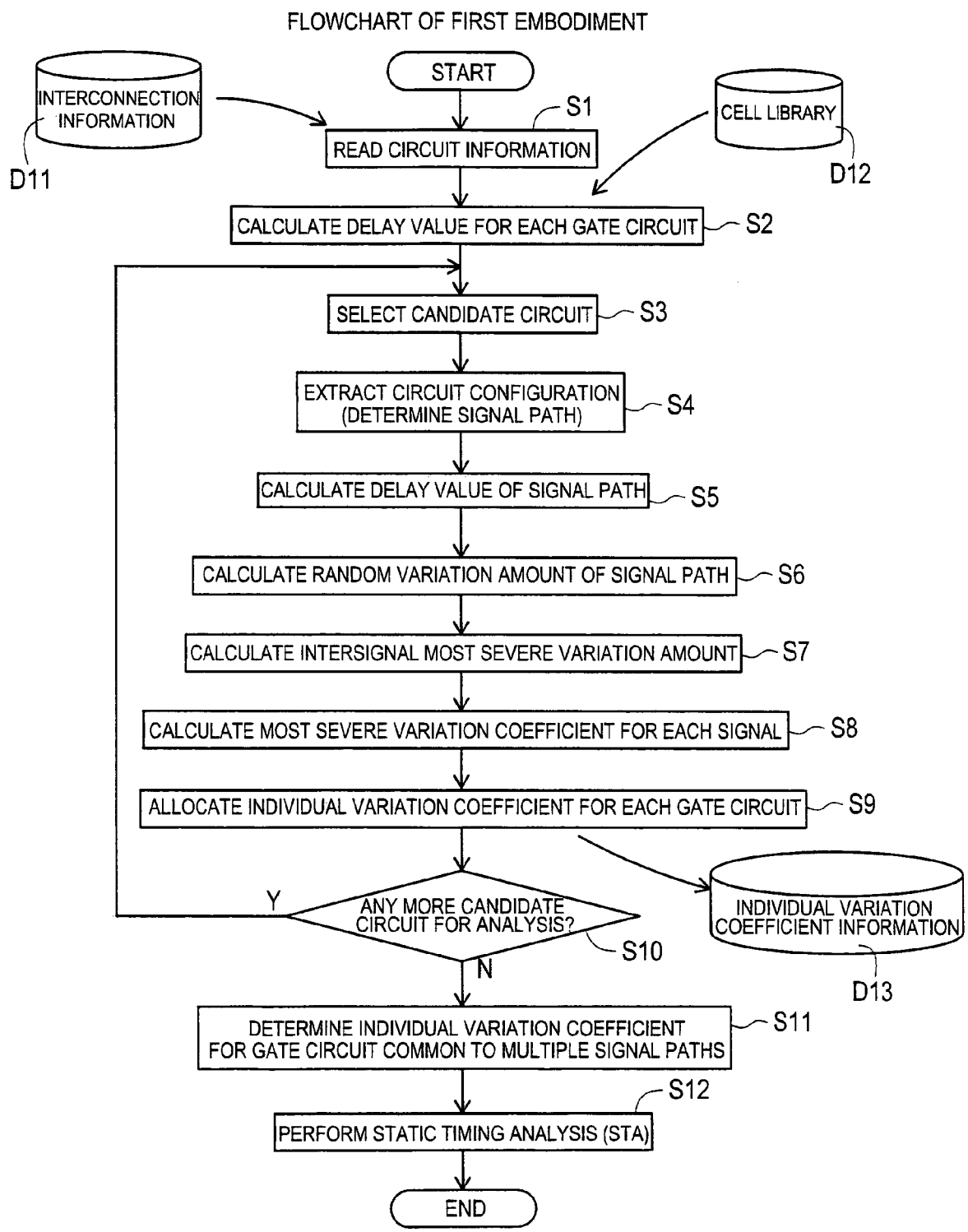
FIG. 1 is a flowchart of a first embodiment of the invention.
Figure 2:
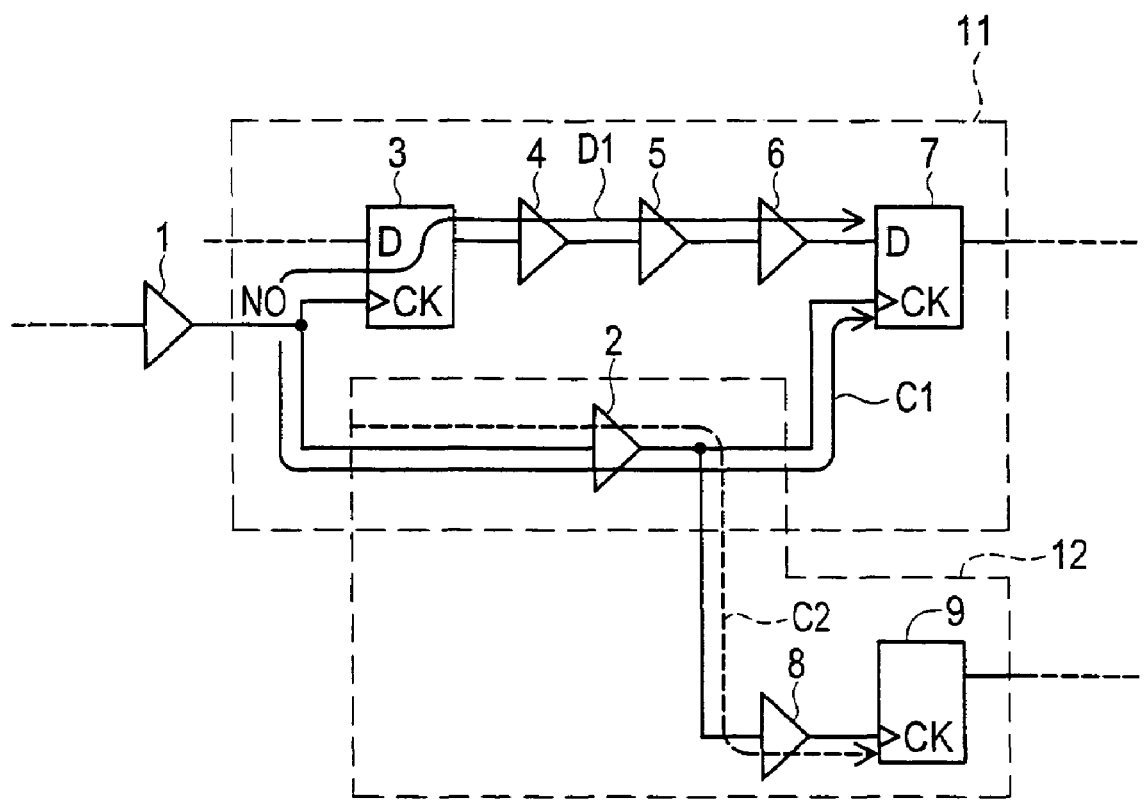
FIG. 2 shows an example of a circuit for application of the first embodiment.

Referring first to FIG. 1, there is shown a flowchart representing a timing analysis method (program) according to a first embodiment of the invention. The flow of a timing analysis when applied to a circuit diagram shown in FIG. 2 is described. FIG. 2 illustrates an example of a circuit that is provided with two flip-flops 7, 9 which are circuits as candidates for timing analysis. In a static timing analysis (STA), the propagation timing between clock signals to clock terminals (CK) of the flip-flops 7, 9 and data signals to data terminals (D) of the flip-flops 7, 9 is analyzed. More specifically, a setup time of a data signal against a clock signal and a hold time of the data signal against the clock signal are analyzed, thereby to analyze the propagation timing of signals. The first embodiment (shown in FIG. 1) is a procedure by which, prior to conducting an analysis by means of STA, propagation delays when propagating, through gate circuits existing along a signal path, to a candidate circuit and their variations are estimated within a rational range by statistical processing and, then, results are provided as analysis information for use in STA.

FIG. 2 shows two circuit blocks, i.e., a circuit block 11 including signal paths to the flip-flop 7 which is one of the two candidate circuits and a circuit block 12 including signal paths to the flip-flop 9 which is the other candidate circuit. The starting point of each of the signal paths of the circuit blocks 11, 12 is an output node N0 of a buffer gate circuit 1. In the circuit block 11, a data signal path D1 extending from the node N0 is connected, through a flip-flop 3 and then through buffer gate circuits 4, 5, 6, to the data terminal D of the flip-flop 7. In addition, a clock signal path C1 extending from the node N0 is connected, through a buffer gate circuit 2, to the data terminal (D) of the flip-flop 7. In the circuit block 12, a clock signal path C2 extending from the node N0 is connected, through the buffer gate circuit 2 and then through a buffer gate circuit 8, to the data terminal (D) of the flip-flop 7. FIG. 2 shows an example case made up of two circuit blocks, namely the circuit blocks 11, 12; however, it should be noted that neither the number of circuit blocks nor the number of gate circuit stages in each circuit block is limited to such an example case.

Returning to the flowchart of FIG. 1, the first embodiment is described. The description which follows will be made with a focus on the circuit block 11; however, it should be noted that the same processing is performable on the circuit block 12 as well as on other circuit blocks (not shown in FIG. 2).

In Step S1, circuit information is first loaded in from interconnection information (D11). Information about wiring connections between gate circuits including the circuit blocks 11, 12 of FIG. 2 is loaded in. In Step S2, a respective delay value for each gate circuit is calculated according to a cell library (D12). A delay value calculated in Step S2 is a delay standard value in each of slowest and fastest operating conditions in the case where the power supply voltage and the operating temperature are parameters. And, the delay standard value is a delay value which is calculated by performing delay calculations based on the cell information of the cell library (D12) with disregard to random variation factors contained in a manufacturing process. With reference to a delay distribution 21 shown in FIG. 3, there is defined a slowest operating condition. That is, in addition to a manufacturing process condition that the circuit operation is slow, the power supply voltage (VDD) is at a minimum level while the operating temperature (T) is at a maximum level within their allowable limits. The slowest operating condition has a delay standard value of μSlow. Further, there is further defined a fastest operating condition. That is, in addition to a manufacturing process condition that the circuit operation is fast, the power supply voltage (VDD) is at a maximum level while the operating temperature (T) is at a minimum level within their allowable limits. The fastest operating condition has a delay standard value of μFast.

Next, a circuit as a candidate for timing analysis is selected in Step S3. Here, it is the flip-flop 7 which is selected as a candidate circuit. Thereafter, a circuit configuration is extracted, thereby to determine signal paths (Step S4). With reference to FIG. 2, the circuit block 11 is extracted, and the data signal path D1 and the clock signal path C1 are determined.

As described above, when a signal path is determined, gate circuits forming the signal path is determined. Delay standard values of these gate circuits are added up, thereby to calculate a delay standard value for the signal path (Step S5). The delay standard value of the signal path is obtained by adding together delay standard values of the gate circuits. In the circuit block 11:

$$\mu DATA = TG(C) + TG(D) + TG(E) + TG(F) \quad (1)$$

$$\mu CK = TG(B) \quad (2)$$

wherein μDATA and μCK are, respectively, the delay standard value of the data signal path D1 and the delay standard value of the clock signal path CK, and TG(X) is the delay standard value of a gate circuit X. More specifically, with respect to each of the data signal path D1 and the clock signal path C1, the delay standard value (μslow) in the slowest operating condition and the delay standard value (μfast) in the fastest operating condition are obtained (see FIG. 3).

Figure 3:
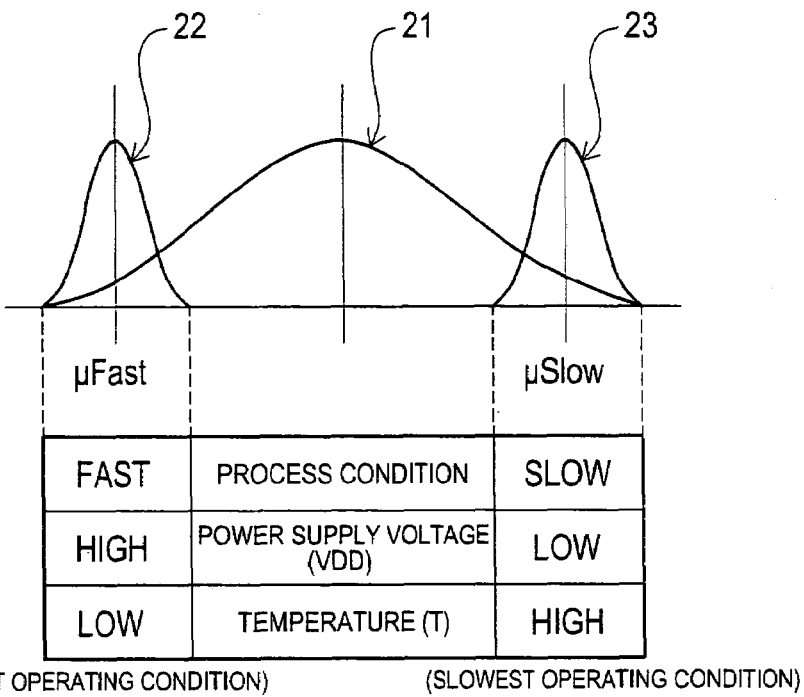
FIG. 3 shows signal delay distributions in a signal path.

Furthermore, based on the random variation amounts of the gate circuits forming the signal path, a random variation amount for the signal path is calculated (Step S6). The random variation amount of the signal path is a variation amount as typified by on-chip variations in semiconductor integrated circuits, and is a variation amount due to an unintended random variation from a predetermined manufacturing process. Such a variation amount exists at random in each gate circuit, and is evaluated as a variance for a delay value of the center value. Therefore, the amount of variation of the signal path calculated in Step S6 may be found by the property of additivity of variance in statistics. In the circuit block 11:

$$\sigma DATA = \sqrt{\sigma(C)^2 + \sigma(D)^2 + (E)^2 + \sigma(F)^2} \quad (3)$$

$$\sigma CK \sqrt{\sigma(B)^2} \quad (4)$$

where σDATA and σCK are, respectively, the amount of random variation of the data signal path D1 and the amount of random variation of the clock signal path C1 and σ(X) is the amount of random variation of the gate circuit X. More specifically, for each of the data signal path D1 and the clock signal path C1, as shown in FIG. 3, delay distributions 22, 23 due to random variations are obtained by taking, as central values, the delay standard value (μSlow) in the slowest operating condition and the delay standard value (μFast) in the fastest operating condition, and the variances of the delay distributions 22, 23 becomes the aforesaid random variation amounts.

In the above, there is shown the case where, as the random variation amount of a signal path, the property of additivity of variance is applied to the random variation amounts of gate circuits forming the signal path, but it may be calculated by applying the property of additivity of variance for each of basic gate circuits (NAND gates, inverter gates etc.) forming a gate circuit and/or for each of transistor elemental devices forming a gate circuit.

Based on the delay values μDATA, μCK and the random variation amounts σDATA, σCK calculated for each of the signal paths D1 and C1, most severe variation amounts in a most severe operating condition (described later) are calculated for two signals that are fed to the flip-flop 7 as a candidate circuit for timing analysis (Step S7). The most severe operating condition is a condition in which, when calculating a setup time and a hold time for each of the slowest operating condition and the fastest operating condition, the coefficient of variation and the amount of random variation in the power supply voltage (VDD) and the operating temperature (T) are taken into consideration. With reference to FIGS. 4 to 7, there are shown most severe operating conditions respectively for different situations.

Figure 4:
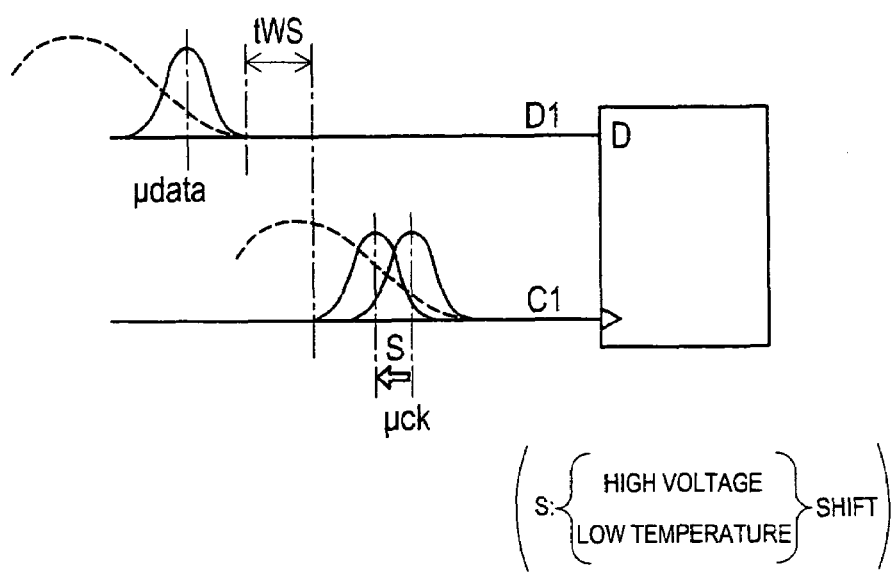
FIG. 4 is a diagram which provides a description of a most severe operating condition (1) (at the time of a setup operation in a slowest operating condition)

Referring first to FIG. 4, there is shown a most severe operating condition (1) (at the time of a setup operation in the slowest operating condition). Because of the slowest operating condition, the operation is one at the higher end of the delay distribution 21 (FIG. 3). In addition, because of the setup operation, prior to propagation of a clock signal through the clock signal path C1, a data signal propagates through a data signal path. Each signal is propagated irregularly according to the delay distribution 23 (FIG. 3).

In the most severe operating condition (1), it is required to consider coefficient of variation (Kocv_wv, Kocv_wt) by the power supply voltage (VDD) and the operating temperature (T), with respect to the delay distribution 23. In the setup operation, the direction of condition severization is either a shift of the data signal delay distribution in the direction of increasing the amount of delay or a shift of the clock signal delay distribution in the direction of decreasing the amount of delay. When taking into consideration a delay distribution shift from the coefficients of variation of the power supply voltage (VDD) and the operating temperature (T), it suffices if only shits in the direction in which the amount of delay decreases are considered in the slowest operating condition. The reason for this is that, because of the presupposition that the condition is the slowest operating condition, there is no shift in the direction in which the amount of delay increases further. That is, either at least one of the variation coefficient Kocv_wv of the power supply voltage or the variation coefficient Kocv_wt of the operating temperature is a coefficient less than 1. In the setup operation, the clock signal's delay distribution is shifted in a direction S in which the amount of delay decreases, in other words, it is shifted in the direction of higher voltage for the power supply voltage (VDD) and, in addition, in the direction of lower temperature for the operating temperature (T). By means of this, a setup time tWS becomes the most severe operating condition (1).

A variation amount, σtWS, of the setup time in the most severe operating condition (1) is calculated as follows.

$$\sigma tWS = (1 - Kocv\_wt \times Kocv\_wv) \times \mu CK + \sqrt{(\sigma CK \times Kocv\_wt \times Kocv\_wv)^2 + \sigma DATA^2} \quad (5)$$

The first term of Expression (5) represents that the center value of the clock signal's delay distribution is shifted in the direction in which the delay value decreases depending on either at least one of the variation coefficient Kocv_wv of the power supply voltage or the variation coefficient Kocv_wt of the operating temperature, and it also shows the amount of reduction of the center value of the setup time by the delay distribution shift. The second term represents the amount of variation of the setup time by the random variation amounts of the clock and data signals. The first sub-term of the second term represents the characteristic that the amount of random variation of the clock signal is varied and compressed by the power supply voltage (VDD) and the operating temperature (T). The second sub-term of the second term represents the amount of random variation of the data signal. Expression (5) is an expression representative of the amount of variation of the setup time in the slowest operating condition.

Figure 5:
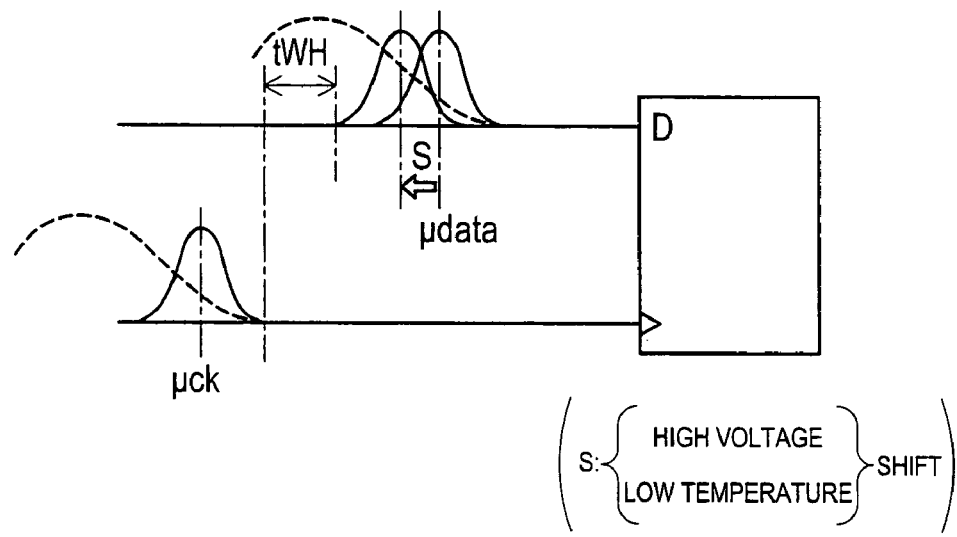
FIG. 5 is a diagram which provides a description of a most severe operating condition (2) (at the time of a hold operation in a slowest operating condition)

Referring now to FIG. 5, there is shown a most severe operating condition (2) (at the time of a hold operation in the slowest operating condition). Because of the slowest operating condition, the operation is one at the higher end of the delay distribution 21 (FIG. 3). In addition, because of the hold operation, subsequent to propagation of a clock signal through the clock signal path C1, a data signal is held in a data signal path. Each signal is propagated irregularly according to the delay distribution 23 (FIG. 3).

In the hold operation, the direction of condition severization is either a shift of the data signal delay distribution in the direction of decreasing the amount of delay or a shift of the clock signal delay distribution in the direction of increasing the amount of delay. When taking into consideration a delay distribution shift from the coefficient of variation of the power supply voltage (VDD) and the operating temperature (T), it suffices if only shifts in the direction in which the amount of delay decreases are considered in the slowest operating condition. In the hold operation, the data signal's delay distribution is shifted in the direction S in which the amount of delay decreases, in other words, it is shifted in the direction of higher voltage for the power supply voltage (VDD) and, in addition, in the direction of lower temperature for the operating temperature (T). By means of this, a hold time tWH becomes the most severe operating condition (2).

An variation amount, σtWH, of the hold time in the most severe operating condition (2) is calculated as follows.

$$\sigma tWH = (1 - Kocv\_wt \times Kocv\_wv) \times \mu DATA + \sqrt{(\sigma DATA \times Kocv\_wt \times Kocv\_wv)^2 + \sigma CK^2} \quad (6)$$

The first term of Expression (6) represents that the center value of the data signal's delay distribution is shifted in the direction in which the delay value decreases depending on either at least one of the variation coefficient Kocv_wv of the power supply voltage or the variation coefficient Kocv_wt of the operating temperature, and it also shows the amount of reduction of the center value of the hold time by the delay distribution shift. The second term represents the amount of variation of the hold time by the random variation amounts of the clock and data signals. The first sub-term of the second term represents the characteristic that the amount of random variation of the data signal is varied and compressed by the power supply voltage (VDD) and the operating temperature (T). The second sub-term of the second term represents the amount of random variation of the clock signal. Expression (6) is an expression representative of the amount of variation of the hold time in the slowest operating condition.

Figure 6:
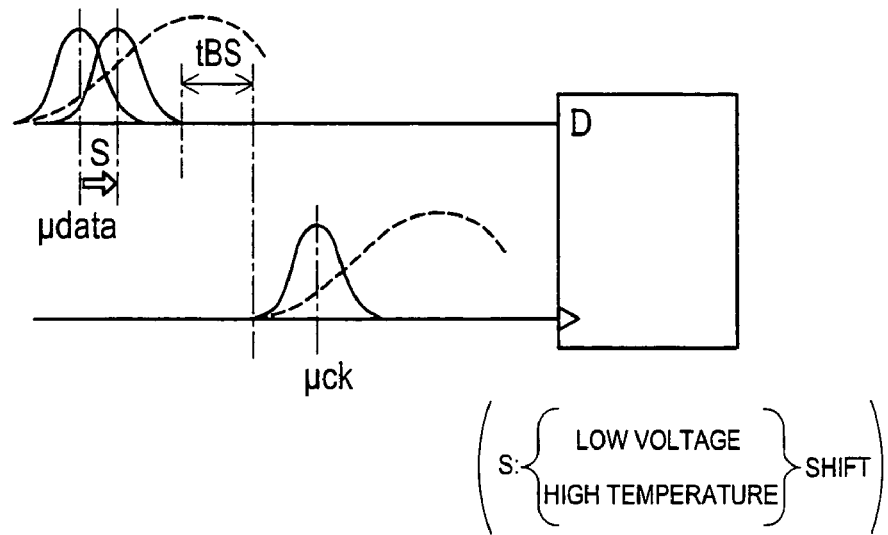
FIG. 6 is a diagram which provides a description of a most severe operating condition (3) (at the time of a setup operation in a fastest operating condition)

Referring to FIG. 6, there is shown a most severe operating condition (3) (at the time of a setup operation in the fastest operating condition). Because of the fastest operating condition, the operation is one at the lower end of the delay distribution 21 (FIG. 3). In addition, because of the setup operation, prior to propagation of a clock signal through the clock signal path C1, a data signal propagates through a data signal path. Each signal is propagated irregularly according to the delay distribution 22 (FIG. 3).

In the most severe operating condition (3), it is required to consider the coefficient of variation (Kocv_bv, Kocv_bt) by the power supply voltage (VDD) and the operating temperature (T), with respect to the delay distribution 22. In the setup operation, the direction of condition severization is either a shift of the data signal delay distribution in the direction of increasing the amount of delay or a shift of the clock signal delay distribution in the direction of decreasing the amount of delay. When taking into consideration a delay distribution shift from the coefficient of variation of the power supply voltage (VDD) and the operating temperature (T), it suffices if only shifts in the direction in which the amount of delay increases are considered in the fastest operating condition. The reason for this is that there is no shift in the direction in which the amount of delay increases further. That is, either at least one of the variation coefficient Kocv_bv of the power supply voltage or the variation coefficient Kocv_bt of the operating temperature is a coefficient larger than 1. In the setup operation, the data signal's delay distribution is shifted in the direction S in which the amount of delay increases, in other words, it is shifted in the direction of lower voltage for the power supply voltage (VDD) and, in addition, in the direction of higher temperature for the operating temperature (T). By means of this, a setup time tBS becomes the most severe operating condition (3).

A variation amount, σtBS, of the setup time in the most severe operating condition (3) is calculated as follows.

$$\sigma tBS = (Kocv\_bt \times Kocv\_bv - 1) \times \mu DATA + \sqrt{(\sigma DATA \times Kocv\_bt \times Kocv\_bv)^2 + \sigma CK^2} \quad (7)$$

The first term of Expression (7) represents that the center value of the data signal's delay distribution is shifted in the direction in which the delay value increases depending on either at least one of the variation coefficient Kocv_bv of the power supply voltage or the variation coefficient Kocv_bt of the operating temperature. Because of this delay distribution shift, the setup time itself is reduced. The second term represents the amount of variation of the setup time by the random variation amounts of the clock and data signals. The first sub-term of the second term represents the characteristic that the amount of random variation of the data signal is varied and expanded by the power supply voltage (VDD) and the operating temperature (T). The second sub-term of the second term represents the amount of random variation of the clock signal. Expression (7) is an expression representative of the amount of variation of the setup time in the fastest operating condition.

Figure 7:
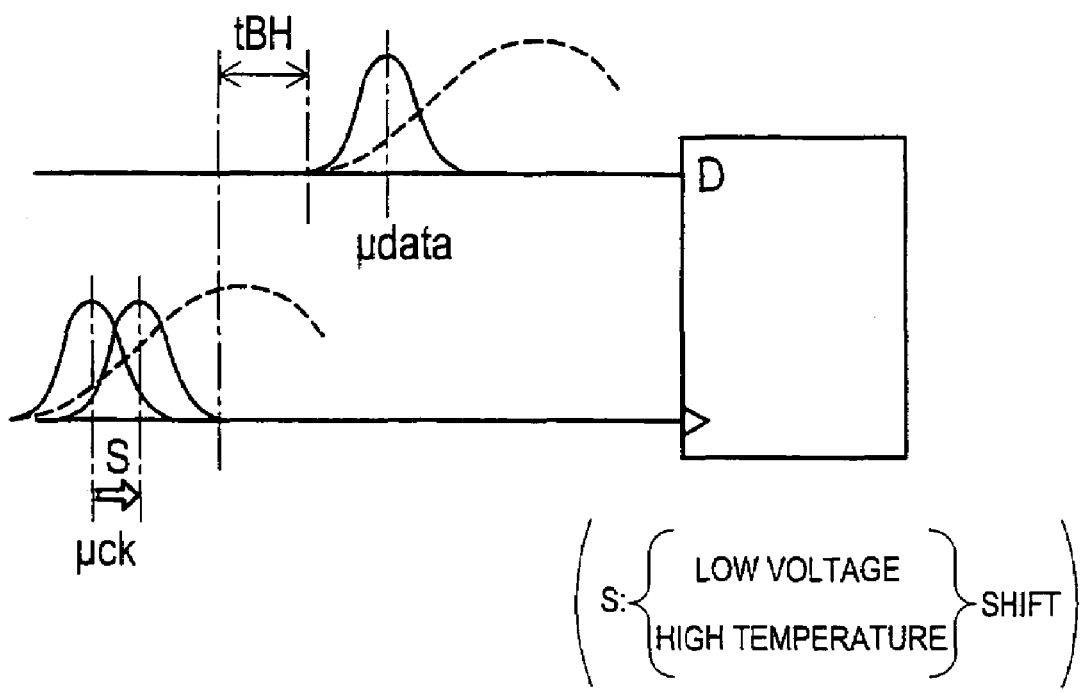
FIG. 7 is a diagram which provides a description of a most severe operating condition (4) (at the time of a hold operation in a fastest operating condition)

Referring now to FIG. 7, there is shown a most severe operating condition (4) (at the time of a hold operation in the fastest operating condition). Because of the fastest operating condition, the operation is one at the lower end of the delay distribution 21 (FIG. 3). In addition, because of the hold operation, subsequent to propagation of a clock signal through the clock signal path C1, a data signal is held in a data signal path. Each signal is propagated irregularly according to the delay distribution 22 (FIG. 3).

In the hold operation, the direction of condition severization is either a shift of the data signal delay distribution in the direction of decreasing the amount of delay or a shift of the clock signal delay distribution in the direction of increasing the amount of delay. When taking into consideration a delay distribution shift from the coefficient of variation of the power supply voltage (VDD) and the operating temperature (T), it suffices if only shifts in the direction in which the amount of delay increases are considered in the fastest operating condition. In the hold operation, the clock signal's delay distribution is shifted in the direction S in which the amount of delay increases, in other words, it is shifted in the direction of lower voltage for the power supply voltage (VDD) and, in addition, in the direction of higher temperature for the operating temperature (T). By means of this, a hold time tBH becomes the most severe operating condition (4).

A variation amount, σtBH, of the hold time in the most severe operating condition (4) is calculated as follows.

$$\sigma tBH = (Kocv\_bt \times Kocv\_bv - 1) \times \mu CK + \sqrt{(\sigma CK \times Kocv\_bt \times Kocv\_bv)^2 + \sigma DATA^2} \quad (8)$$

The first term of Expression (8) represents that the center value of the clock signal's delay distribution is shifted in the direction in which the delay value increases depending on either at least one of the variation coefficient Kocv_bv of the power supply voltage or the variation coefficient Kocv_bt of the operating temperature. Because of this delay distribution shift, the hold time itself is reduced. The second term represents the amount of variation of the hold time by the random variation amounts of the clock and data signals. The first sub-term of the second term represents the characteristic that the amount of random variation of the clock signal is varied and expanded by the power supply voltage (VDD) and the operating temperature (T). The second sub-term of the second term represents the amount of random variation of the data signal. Expression (8) is an expression representative of the amount of variation of the hold time in the fastest operating condition.

Referring again to the flowchart of FIG. 1, the amount of intersignal most severe variation calculated in Step S7 is allocated to each signal according to the most severe operating conditions (1)-(4). Then, a most severe variation coefficient is calculated for each signal in Step S8.

In the most severe operating condition (1), the variation coefficient (Kocv_wv, Kocv-wt) by the power supply voltage (VDD) and the operating temperature (T), as the direction of condition severization, is operated on the clock signal and no shift is performed on the data signal, as represented by Expression (5). Of the most severe variation amount, the random variation amount of the non-shift data signal, σDATA, is allocated, as it is, to the random variation amount of the data signal, and the remaining is allocated to the clock signal.

Most severe variation coefficients, OCV_ws_data, OCV_ws_ck, defined by division of the allocated most severe variation amounts by the delay standard value, are calculated as follows.

$$OCV\_ws\_data = \sigma DATA / \mu DATA$$

$$OCV\_ws\_ck = [\{(1 - Kocv\_wt \times Kocv\_wv) \times \mu CK + \sqrt{(\sigma CK \times Kocv\_wt \times Kocv\_wv)^2 + \sigma DATA^2}\} - \sigma DATA] / \mu CK \quad (9)$$

In the most severe operating condition (2), the variation coefficient (Kocv_wv, Kocv-wt) by the power supply voltage (VDD) and the operating temperature (T), as the direction of condition severization, is operated on the data signal and no shift is performed on the clock signal, as represented by Expression (6). Of the most severe variation amount, the random variation amount of the non-shift clock signal, σCK, is allocated, as it is, to the random variation amount of the data signal, and the remaining is allocated to the data signal.

Most severe variation coefficients, OCV_wh_data, OCV_wh_ck, defined by division of the allocated most severe variation amounts by the delay standard value, are calculated as follows.

$$OCV\_wh\_data=[\{(1-Kocv\_wt \times Kocv\_wv) \times \mu DATA + \sqrt{(\sigma DATA \times Kocv\_wt \times Kocv\_wv)^2 + \sigma CK^2}\} - \sigma CK]/\mu DATA$$

$$OCV\_wh\_ck = \sigma CK/\mu CK \quad (10)$$

In the most severe operating condition (3), the variation coefficient (Kocv_wv, Kocv-wt) by the power supply voltage (VDD) and the operating temperature (T), as the direction of condition severization, is operated on the data signal and no shift is performed on the clock signal, as represented by Expression (7). Of the most severe variation amount, the random variation amount of the non-shift clock signal, σCK, is allocated, as it is, to the random variation amount of the clock signal, and the remaining is allocated to the data signal.

Most severe variation coefficients, OCV_bs_data, OCV_bs_ck, defined by division of the allocated most severe variation amounts by the delay standard value, are calculated as follows.

$$OCV\_bs\_data=[\{(Kocv\_bt \times Kocv\_bv-1) \times \mu DATA + \sqrt{(\sigma DATA \times Kocv\_bt \times Kocv\_bv)^2 + \sigma CK^2}\} - \sigma CK]/\mu DATA$$

$$OCV\_bs\_ck = \sigma CK/\mu CK \quad (11)$$

In the most severe operating condition (4), the variation coefficient (Kocv_wv, Kocv-wt) by the power supply voltage (VDD) and the operating temperature (T), as the direction of condition severization, is operated on the clock signal and no shift is performed on the data signal, as represented by Expression (8). Of the most severe variation amount, the random variation amount of the non-shift data signal, σDATA, is allocated, as it is, to the random variation amount of the data signal, and the remaining is allocated to the clock signal.

Most severe variation coefficients, OCV_bh_data, OCV_bh_ck, defined by division of the allocated most severe variation amounts by the delay standard value, are calculated as follows.

$$OCV\_bh\_data = \sigma DATA/\mu DATA$$

$$OCV\_bh\_ck=[\{(Kocv\_bt \times Kocv\_bv-1) \times \mu CK + \sqrt{(\sigma CK \times Kocv\_bt \times Kocv\_bv)^2 + \sigma DATA^2}\} - \sigma DATA]/\mu CK \quad (12)$$

Returning to the flowchart of FIG. 1, next, a respective individual variation coefficient is allocated for each gate circuit, based on the calculated most severe variation coefficient (Step S9).

The individual variation coefficients are allocated, such that in the setup operation of a data signal against a clock signal, the most severe variation coefficient of the clock signal is allocated as a minimum coefficient and the most severe variation coefficient of the data signal is allocated as a maximum coefficient. On the other hand, in the hold operation, the most severe variation coefficient of the data signal is allocated as a minimum coefficient and the most severe variation coefficient of the clock signal is allocated as a maximum coefficient. In this case, if the standard coefficient is standardized to 1, then the minimum coefficient is found by subtracting the most severe variation coefficient from 1, and the maximum coefficient is found by adding the most severe variation coefficient to 1.

If the individual variation coefficient are represented in a form of (minimum coefficient, standard coefficient (=1), maximum coefficient), they may be: (1−OCV_ws_ck, 1, 1+OCV_ws_data) in the most severe operating condition (1); (1−OCV_wh_data, 1, 1+OCV_wh_ck) in the most severe operating condition (2); (1−OCV_bs_ck, 1, 1+OCV_bs_data) in the most severe operating condition (3); and (1−OCV_bh_data, 1, 1+OCV_bh_ck) in the most severe operating condition (4).

Returning to the flowchart of FIG. 1, it is checked whether there still remains a circuit as a candidate for timing analysis (Step S10). If so (Step S10: YES), then the procedure returns to Step S3 for selection of a new candidate circuit and the same steps as above are repeated. In the circuit example of FIG. 2, the flip-flop 9, selected as a new candidate circuit, is processed in the same way as the flip-flop 7. If there remains no candidate circuit (Step S10: NO), then the procedure proceeds to Step S11. An individual variation coefficient is determined for a gate circuit common between a plurality of signal paths (Step S11). In FIG. 2, the buffer gate circuit 2 exists as a common gate circuit to the clock signal paths C1 and C2.

With respect to the buffer gate circuit 2, either at least one of the minimum or maximum coefficients calculated for the clock signal path C1 and either at least one of the minimum or maximum coefficients calculated for the clock signal path C2 are compared, wherein a minimum value is selected for the minimum coefficient while, on the other hand, a maximum value is selected for the maximum coefficient.

By the foregoing steps S1 to S11, individual variation coefficients available in STA are calculated for the respective gate circuits. These coefficients are utilized by an STA tool which then performs a timing analysis in Step S12. In addition, they may be outputted as delay information for each gate circuit (individual variation coefficient information (D13)).

Figure 8:
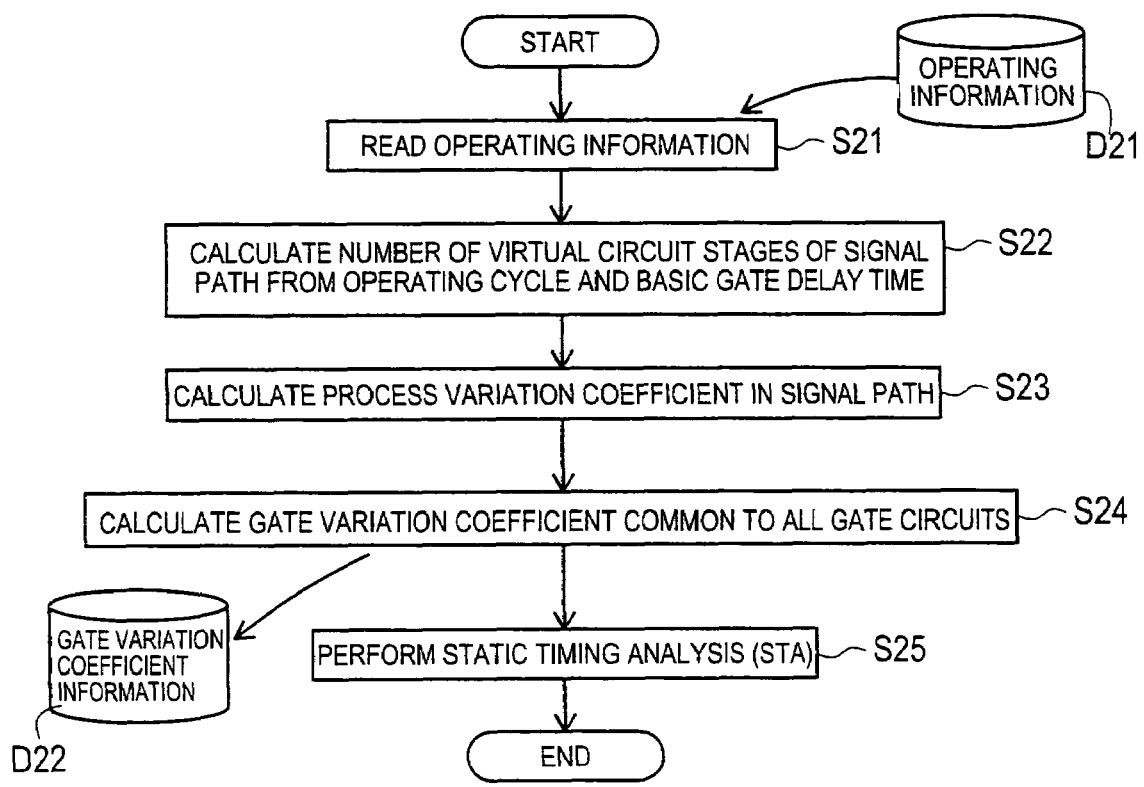
FIG. 8 is a flowchart of a second embodiment of the invention.

Referring to FIG. 8, there is shown a flowchart representative of a timing analysis method and a timing analysis program in accordance with a second embodiment of the invention. The second embodiment requires neither the interconnection information (D11) (the circuit diagram of FIG. 2) nor the cell library (D12) required in the processing of the first embodiment. Without extraction of a specific circuit configuration, the number of circuit stages is estimated from operation information (D21), and a signal propagation delay and its variation coefficient are calculated by making utilization of statistical processes for forwarding to the STA tool as analysis information, as will be described later.

The operation information (D21) is first loaded in (Step S21). And, the number of virtual circuit stages is calculated from an operation cycle and a basic gate delay time of the operation information (Step S22).

Figure 9:
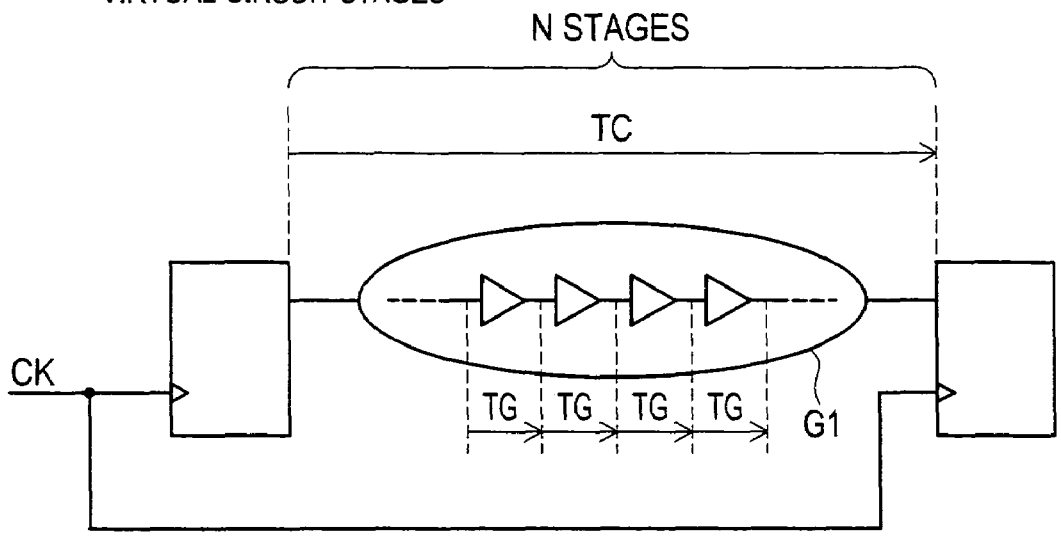
FIG. 9 is a conceptual diagram illustrating a calculation of the number of virtual circuit stages.

Referring to FIG. 9, Step S22 is described. FIG. 9 shows a circuit diagram which illustrates a typical circuit configuration on which timing analysis is performed by means of STA. In the STA, a timing analysis is carried out according to the propagation timing of a signal in a signal path connected to a flip-flop. In a signal path sandwiched between two flip-flops which are driven by the same clock signal CK, the propagation time allowable for a signal which propagates from an output terminal of a preceding-stage flip-flop to an input terminal of a subsequent-stage flip-flop may be an approximate operation cycle TC. The reason for this is that since the contents of the flip-flops are updated at every operation cycle TC in sync with the clock signal CK, it is required that the output signal of the preceding-stage flip-flop updated by the clock signal TC be propagated to the input terminal of the subsequent-stage flip-flop before the next clock signal.

It is assumed that in the second embodiment, a signal path between flip-flops is connected by a circuit group G1 virtually formed by basic gate circuits. If the basic gate delay time, TG, of a basic gate circuit is given, then the number of virtual circuit stages, N, of the basic gate circuit forming the signal path is calculated by: N=TC/TG.

Referring back to the flowchart of FIG. 8, a process variation coefficient in the first severization operating condition in the signal path is calculated based on the calculated number of virtual circuit stages (Step S23).

Figure 10:
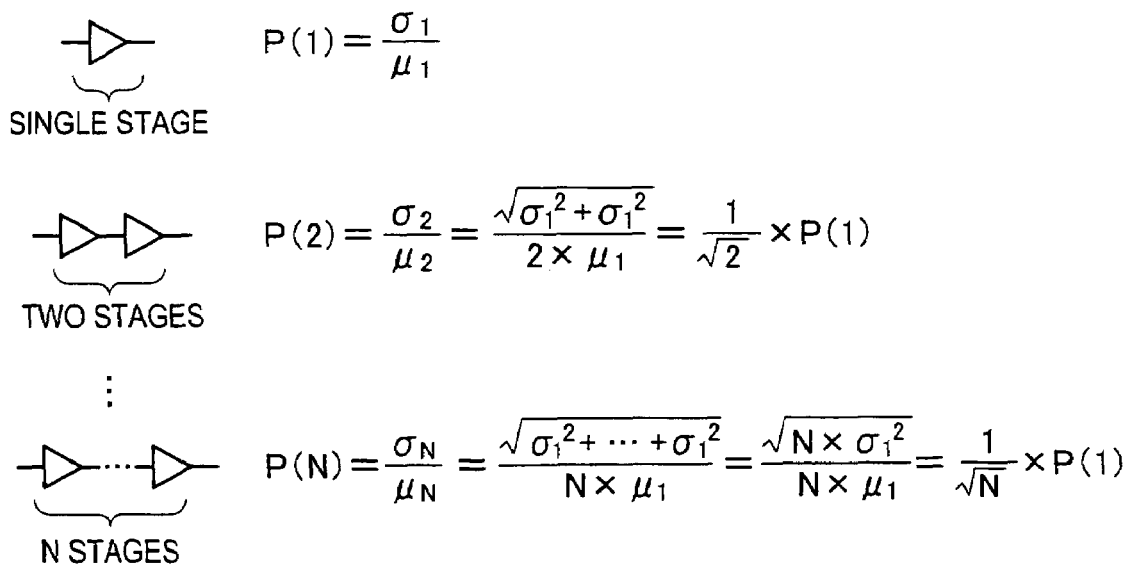
FIG. 10 is an explanatory diagram illustrating calculations of process variation coefficients for the case of multistage connection.

In the first place, based on FIG. 10, a process variation coefficient is calculated for the case where two or more stages of basic gate circuits, i.e., N≧2, are connected. Here, suppose that the process variation coefficient, P(1), of a single-stage basic gate circuit, as a piece of the operation information (D21), is known (P(1)=σ1/μ1 where μ1 indicates the gate delay standard value in the basic gate circuit and σ1 indicates the amount of variation of the standard value μ1 in the basic gate circuit).

With reference to FIG. 10, if basic gate circuits of two-stages are connected, then, in consideration of the property of additivity of variance, a process variation coefficient P(2) in such a two-stage connection signal path is calculated as follows.

$$P(2)=\sigma 2/\mu 2=\sqrt{\sigma 1^2+\sigma 1^2}/(\mu 1+\mu 1)=(1/\sqrt{2})\times P(1) \qquad (13)$$

Hereinafter, other coefficients, i.e., P (3 ..., N), are calculated in the same way depending on the number of stages. For example, a process variation coefficient P(N) for the case where basic gate circuits of N stages are connected is calculated as follows.

$$P(N)=\sigma N/\mu N=(1/\sqrt{N})\times P(1) \qquad (14)$$

By means of this, in the case where the circuit group G1 made up of basic gate circuits is connected to the signal path, the process variation coefficient P(N), when the number of virtual circuit stages=N, is calculated based on the process variation coefficient P(1) for a single basic gate circuit stage.

Hereafter, the first severization operating condition will be described. The first severization operating condition is determined by evaluating marginal conditions in the setup and hold operations for each of the slowest and fastest operating conditions. The marginal condition in the setup operation is shown, in FIG. 11, as the first severization operating condition (1). On the other hand, the marginal condition in the hold operation is shown, in FIG. 12, as the first severization operating condition (2).

Figure 11:
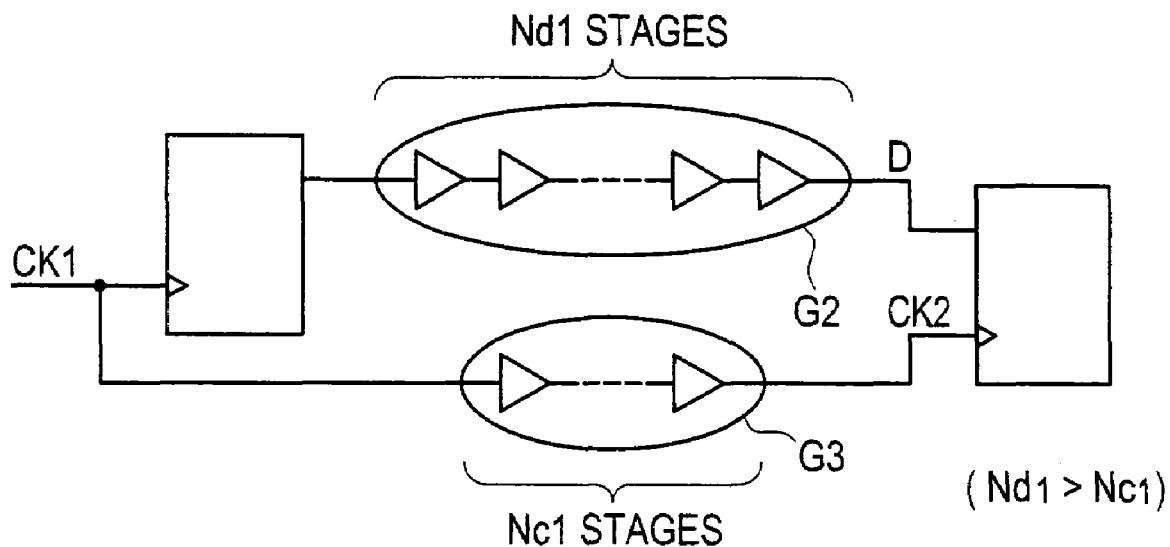
FIG. 11 is a diagram which provides a description of a first severization operating condition (1) (at the time of a setup operation)
Figure 11:
Figure 11:
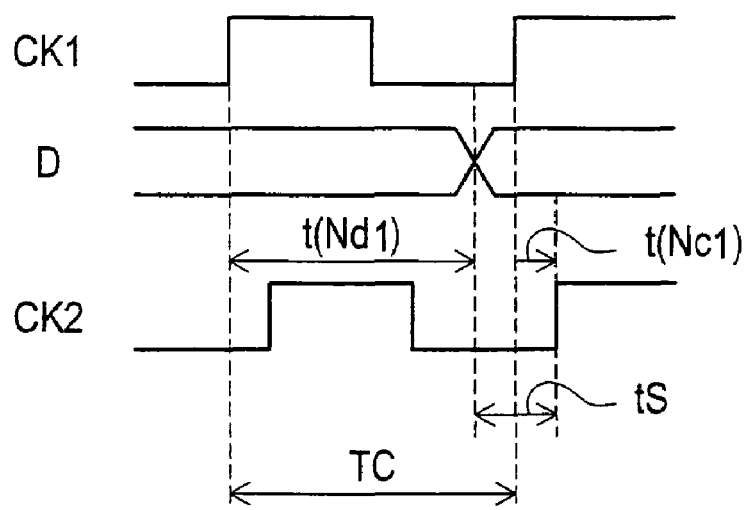

Referring to FIG. 11, with respect to the basic clock signal CK1, the data signal D propagates from the output terminal of a preceding-stage flip-flop to a subsequent-stage flip-flop through a circuit group G2 of a virtual circuit stage count Nd1 and the clock signal CK2 propagates to the subsequent-stage flip-flip circuit through a circuit group G3 of a virtual circuit stage count Nc1. The setup operation of the data signal D is described in detail. Referring to an operation wave form chart of FIG. 11, for the predetermined timing clock signal CK1, the data signal D to be fed to the subsequent-stage flip-flop propagates from the output terminal of the preceding-stage flip-flop at a propagation delay t (Nd1) by the virtual circuit stage count Nd1. As previously described, the propagation delay t (Nd1) of the data signal D is required to be a timing shorter than the operation cycle TC. Furthermore, for the next cycle timing clock signal CK1, the clock signal CK2 propagates at the propagation delay t (Nc1) by the virtual circuit stage count Nc1. The setup time tS is the time that the data signal D is set prior to the clock signal CK2.

Accordingly, if the propagation delay t (Nd1) of the signal path along which the data signal D propagates is larger than the propagation delay t (Nc1) of the signal path along which the clock signal CK2 propagates, then a most severe operating condition for the setup time (i.e., the first severization operating condition (1)) is obtained. The condition is that the virtual circuit stage count Nd1 in the signal path along which the data signal D propagates is greater than the virtual circuit stage count Nc1 in the signal path along which the clock signal CK2 propagates.

Figure 12:
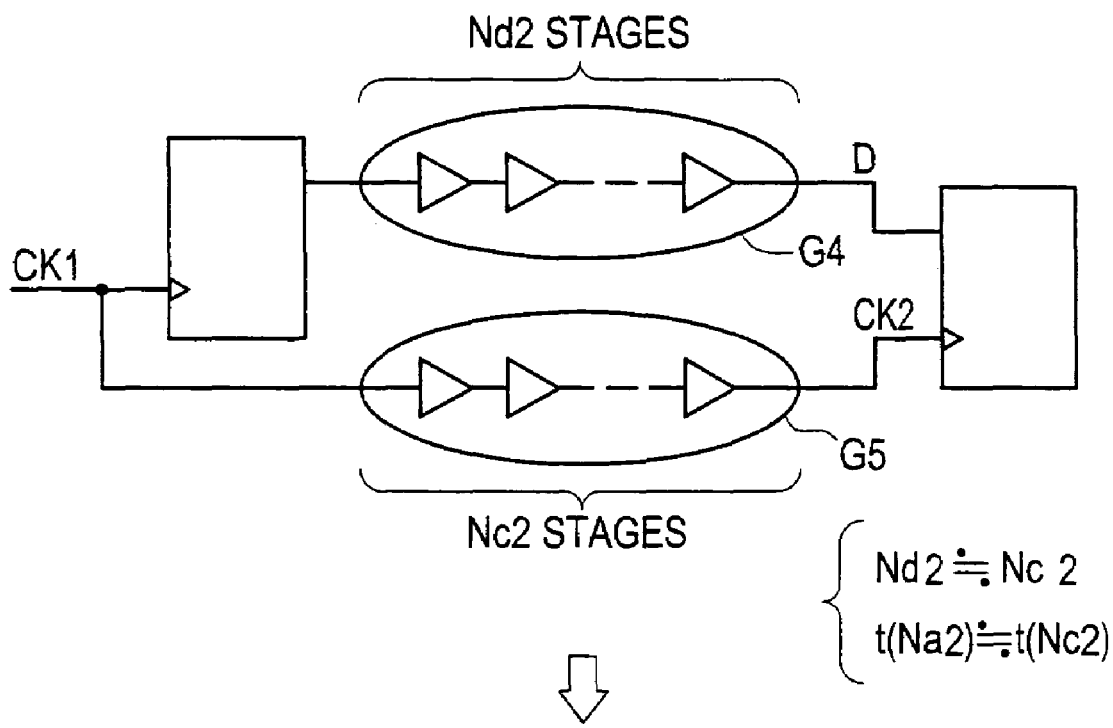
FIG. 12 is a diagram which provides a description of a first severization operating condition (2) (at the time of a hold operation)
Figure 12:
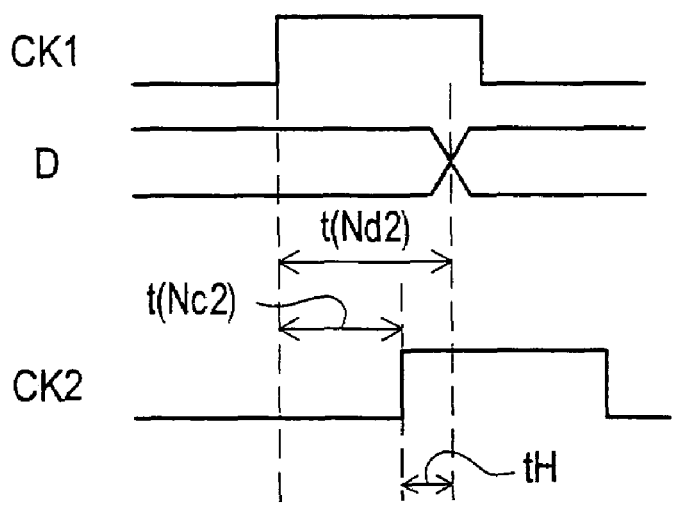

Referring to FIG. 12, with respect to the basic clock signal CK1, the data signal D propagates from the output terminal of a preceding-stage flip-flop to a subsequent-stage flip-flop through a circuit group G4 of a virtual circuit stage count Nd2 and the clock signal CK2 propagates to the subsequent-stage flip-flip circuit through a circuit group G5 of a virtual circuit stage count Nc2. The hold operation of the data signal D is described in detail. Referring to an operation wave form chart of FIG. 12, for the predetermined timing clock signal CK1, the data signal D to be fed to the subsequent-stage flip-flop propagates from the output terminal of the preceding-stage flip-flop at a propagation delay t (Nd2) by the virtual circuit stage count Nd2. As previously described, the propagation delay t (Nd2) of the data signal D is required to be a timing shorter than the operation cycle TC. On the other hand, the clock signal CK1 propagates as the clock signal CK2 at the propagation delay t (Nc2) by the virtual circuit stage count Nc2. The hold time tH is the time that the data signal D is held subsequent to the clock signal CK2.

Both the data signal D and the clock signal CK2 are signals that propagate from the same clock signal CK1. Accordingly, if the propagation delay t (Nd2) of the signal path along which the data signal D propagates falls below the propagation delay t (Nc2) of the signal path along which the clock signal CK2 propagates, the operating condition becomes severe. Furthermore, it is known that as the number of circuit stages in a signal path decreases the operating condition becomes severer (not shown). These conditions together provides the first severization operating condition (2). If the virtual circuit stage count Nd2 in the signal path along which the data signal D propagates falls below the virtual circuit stage count Nc2 in the signal path along which the clock signal CK2 propagates and the value of each of the virtual circuit stage counts Nd2, Nc2 is small, this provides a normal operating condition.

In Step S23 of the flowchart of FIG. 8, a process variation coefficient in the signal path is calculated in consideration of the first severization operating condition discussed in conjunction with FIGS. 11 and 12.

For example, in regard to the first severization operating condition (1) at setup operation time, the virtual circuit stage count Nd1 calculated in Step S22 as the number of propagation path stages is set as a maximum stage count in the signal path of the data signal D. In the signal path of the clock signal CK2, a predetermined stage count Nc0 is estimated as a minimum stage count from a clock tree structure or the like.

In addition, in regard to the first severization operating condition (2) at hold operation time, ½ of the virtual circuit stage count Nd2 calculated in Step S22 is chosen as the number of propagation path stages.

Here, the slowest and fastest operating conditions are represented as the process variation coefficient P(1) for a single basic gate circuit stage stored as the operation information (D21). In other words, they have, as the process variation coefficient P(1), a process variation coefficient PW(1) in the slowest operating condition and a process variation coefficient PB(1) in the fastest operating condition.

From Expression (14) and the process variation coefficient PW(1), the process variation coefficient in the signal path in the slowest operating condition is calculated in the following way.

In the setup operation, the coefficient in the signal path of the data signal D is assigned as a maximum coefficient ws_max while, on the other hand, the coefficient in the signal path of the clock signal CK is assigned as a minimum coefficient ws_min. If, in the slowest operating condition, the process variation coefficient in the data signal path and the process variation coefficient of the clock signal path are, respectively, PWD(1) and PWC(1) for a single basic gate circuit stage, then the following is obtained.

$$ws\_max = PWD(1)/\sqrt{Nd1}$$

$$ws\_min = PWC(1)/\sqrt{NC0} \qquad (15)$$

In addition, in the hold operation, the coefficient in the signal path of the clock signal CK2 is assigned as a maximum coefficient wh_max while, on the other hand, the coefficient in the signal path of the data signal D is assigned as a minimum coefficient wh_min. The following is obtained.

$$wh\_max = PWC(1)/\sqrt{Nd2/2}$$

$$wh\_min = PWD(1)/\sqrt{Nd2/2} \qquad (16)$$

In addition, from Expression (14) and the process variation coefficient PB(1), the process variation coefficient in the signal path in the fastest operating condition is calculated as follows.

In the hold operation, the coefficient in the signal path of the clock signal CK2 is assigned as a maximum coefficient bh_max while, on the other hand, the coefficient in the signal path of the data signal D is assigned as a minimum coefficient bh_min. If the process variation coefficient in the data signal path in the fastest operating condition and the process variation coefficient of the clock signal path are, respectively, PBD(1) and PBC(1) for a single basic gate circuit stage, then the following is obtained.

$$bh\_max = PBC(1)/\sqrt{Nd2/2}$$

$$bh\_min = PBD(1)/\sqrt{Nd2/2} \qquad (17)$$

Further, in the fastest operating condition, the setup operation, since it is never in a critical timing condition, is not considered in the second embodiment.

Returning back to the flowchart of FIG. 8, a gate variation coefficient common to all of the gate circuits forming the signal path is calculated (Step S24).

In the slowest operating condition, the coefficients calculated in the conditions of the setup and hold operations are averaged. In this case, the second severization operating condition is considered as a shift of the delay distribution by the power supply voltage (VDD) and the operating temperature (T). This is the equivalent of a shift of the delay distribution in the direction of decreasing the delay value in the slowest operating condition. In other words, the delay distribution is shifted in the direction of increasing the power supply voltage (VDD) to higher level and decreasing the operating temperature (T) to lower level. This is considered on the maximum coefficient ws_min in the setup operation and the minimum coefficient wh_min in the hold operation. This corresponds to a shift of the delay distribution of the clock signal CK2 in the direction of decreasing the delay value in the setup operation condition as well as to a shift of the delay distribution of the data signal D in the direction of decreasing the delay value in the hold operation condition. This is calculated by multiplication of the variation coefficient (Kocv_wv, Kocv_wt) by the power supply voltage (VDD) and the operating temperature (T). A maximum coefficient OCVW_max and a minimum coefficient OCVW_min of the gate variation coefficient are calculated as follows.

$$OCVW\_max = \{(1+ws\_max)+(1+wh\_max)\}/2$$

$$OCVW\_min = Kocv\_wv \times Kocv\_wt \times \{(1-ws\_min)+(1-wh\_min)\}/2 \qquad (18)$$

In regard to the fastest operating condition, they are calculated based on the coefficient calculated in the hold operation condition. In this case, the second severization operating condition, considered as a shift of the delay distribution by the power supply voltage (VDD) and the operating temperature (T), is the equivalent of a shift of the delay distribution in the direction of increasing the delay value. Stated another way, the delay distribution is shifted in the direction of decreasing the power supply voltage (VDD) to lower level and increasing the operating temperature (T) to higher level. This is considered on the maximum coefficient bh_max in the hold operation. This is the equivalent of a shift of the delay distribution of the clock signal CK2 in the direction of increasing the delay value in the hold operation condition. This is calculated by multiplication of the variation coefficient (Kocv_bv, Kocv_bt) by the power supply voltage (VDD) and the operating temperature (T). A maximum coefficient OCVB_max and a minimum coefficient OCVB_min of the gate variation coefficient are calculated as follows.

$$OCVB\_max = Kocv\_bv \times Kocv\_bt \times \{bh\_max+1\}$$

$$OCVB\_min = 1 - bh\_min \qquad (19)$$

Referring back to the flowchart of FIG. 8, the gate variation coefficient calculated in Step S24 is allocated, in common, to the gate circuits connected to the signal path, thereby to perform a timing analysis (Step S25). In addition, as the gate circuit delay information, gate variation coefficient information (D22) may be outputted.

Figure 13:
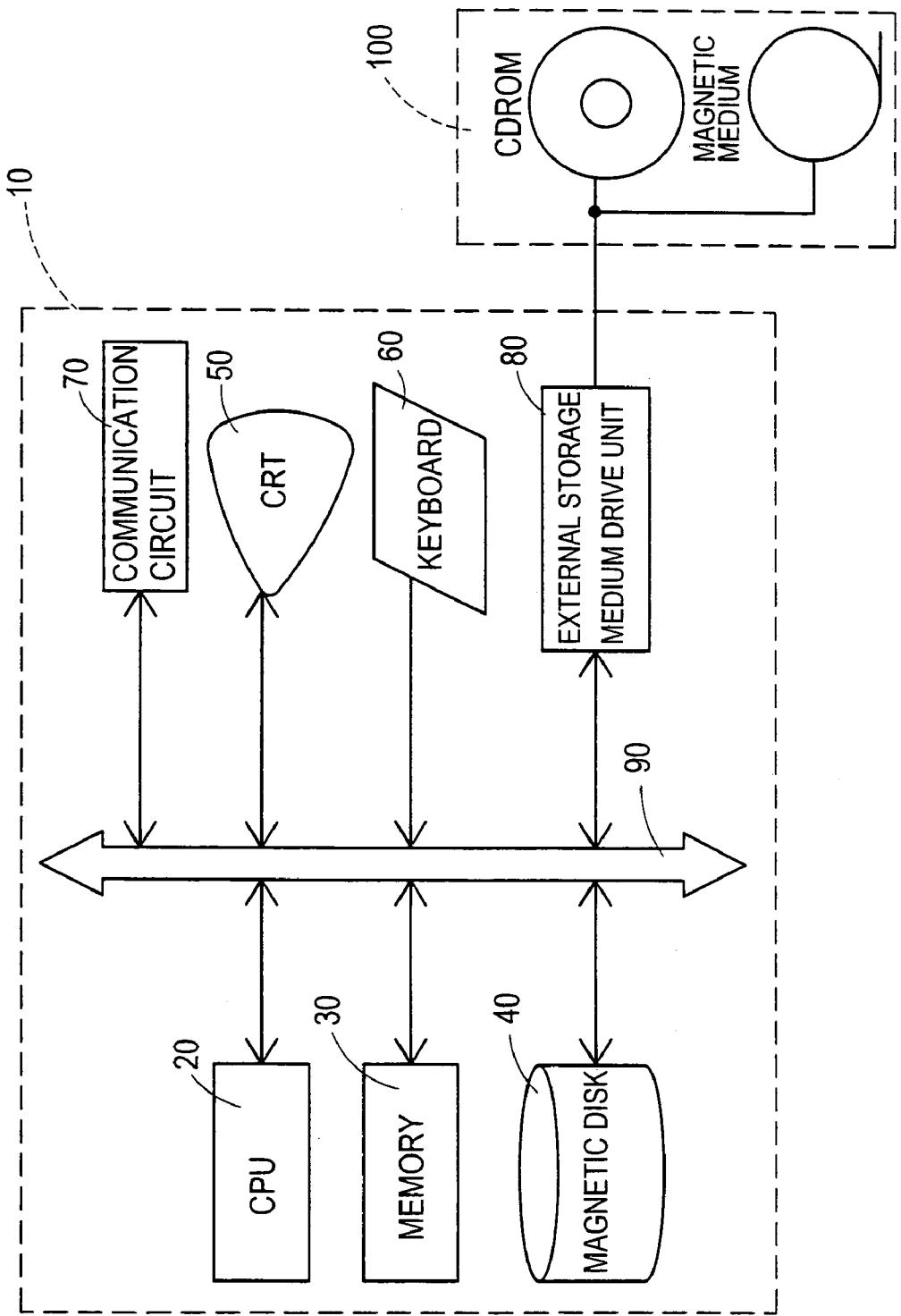
FIG. 13 is a diagram showing an arrangement of a timing analysis tool of the invention.

Referring now to FIG. 13, there is shown an arrangement of a timing analysis tool according to the present invention. The timing analysis tool is capable of performing a timing analysis procedure of the first embodiment (FIG. 1) and a timing analysis procedure of the second embodiment (FIG. 8). The timing analysis tool 10 comprises a bus 90 that connects a central processing unit (hereinafter CPU) 20 with other devices including a memory device 30, a magnetic disk storage 40, a display unit (CRT) 50, a keyboard 60, a communication line 70 such as the Internet, and an external storage medium drive unit 80. In addition, an external storage medium 100, such as CD-ROM, magnetic medium etc., is removably connected to the external storage medium drive unit 80.

A program for execution of the timing analysis procedure of the first embodiment (FIG. 1) and a program for execution of the timing analysis procedure of the second embodiment (FIG. 8) are saved in the memory device 30 or in the magnetic disk storage 40. If saved in the external storage medium 100 (CD-ROM, magnetic medium etc.), the program is either saved in the memory device 30 or in the magnetic disk storage 40 via the external storage medium drive unit 80 or is directly transferred to the CPU 20. In addition, the interconnection information (D11), the cell library (D12), and the operation information (D21) are saved in the magnetic disk storage 40 or in the external storage medium 100 such as magnetic medium, and are referred to in response to instructions from the CPU 20 according to the processing of the program as needed. And, calculated individual variation coefficients and gate variation coefficients are stored in the magnetic disk storage 40 or in the external storage medium 100 (e.g., CD-ROM, magnetic storage etc.) as the individual variation coefficient information (D13) and as the gate variation information (D22), respectively.

In addition, through the communication line 70 such as the Internet, the interconnection information (D11), the cell library (D12) and the operation information (D21) and/or the individual variation coefficient information (D13) and the gate variation coefficient information (D22) may be transferred between the timing analysis tool 10 and other different systems.

As has been described above in detail, in accordance with the timing analysis method, the timing analysis program, and the timing analysis tool in the first embodiment, statistical processes are performed on the condition that the delay random variation amount is normally distributed, so that variations are not cumulated depending on the number of gate circuit stages in a signal propagation path. Besides, other than the random variation amount may be taken into consideration by defining a most severe operating condition. Accordingly, the amount of variation in a timing analysis operation is obtained with high accuracy and, without necessity to excessively assure an operation margin for guaranteeing circuit operations, it is possible to perform an optimum timing analysis.

In addition, the timing analysis method, the timing analysis program, and the timing analysis tool in accordance with the second embodiment eliminate the need for the provision of information as to an individual signal path and gate circuits forming the individual signal path whenever performing statistical processes on the delay random variation amount, and it is possible to perform an optimum timing analysis in a short period of time.

It becomes possible to perform a reliable analysis in the timing verification. There is accomplished improvement in convergence of the timing analysis. The invention contributes to cutting design time and to accomplishing improvements in the quality of timing verification.

It is to be understood that the invention is not limited to the aforesaid embodiments. It is further understood that various changes and modifications may be made in the invention without departing from the sprit and scope thereof. For example, the first embodiment and the second embodiment has been described separately; however, the invention is not limited thereto, and timing analysis may be performed by appropriately selecting a signal path to be applied.

In accordance with the invention, the amount of variation of a delay that exists in a signal path is processed statistically and timing verification is conducted in an optimum condition without any excessive variations. Therefore, it becomes possible to perform reliable analysis in the timing verification and to improve convergence in the timing analysis, thereby contributing to cutting design time and to accomplishing improvements in quality in the timing verification.

What is claimed is:

1. A timing analysis method to perform a verification of the propagation timing of two signals between signal paths, the method comprising:
   (a) obtaining a delay value of a signal propagating through a signal path selected as a candidate for timing analysis;
   (b) obtaining, a random variation amount of the delay value through the signal path, which is a root-mean-square value of variation amounts of gate circuit stages forming the signal path based on a statistical property of additivity of variance;
   (c) obtaining, based on the delay value and the random variation amount, a most severe variation amount between the two signals in a most severe operating condition;
   (d) obtaining a respective most severe variation coefficient for each of the signals by allocation of the most severe variation amount to the two signals according to the most severe operating condition;
   (e) allocating, based on the most severe variation coefficient, a respective individual variation coefficient for each of the gate circuits; and
   (f) performing, based on the individual variation coefficient, by a timing analysis tool,
   wherein the most severe operating condition is a condition that allowable degree of a set-up property and/or a hold property decreases due to a power source voltage and/or an operating temperature under a slowest operating condition and/or a fastest operating condition of the set-up property and/or the hold property, and
   wherein the most severe variation amount is a variation amount obtained under the most severe operating condition.

2. The timing analysis method as set forth in claim 1, wherein the delay value is a standard value in a slowest operating condition and/or in a fastest operating condition.

3. The timing analysis method as set forth in claim 1, wherein the random variation amount is arithmetically calculated by the root-mean-squaring random variation amount for each of the gate circuits, based on the property of additivity of variance in a normal distribution.

4. The timing analysis method as set forth in claim 3, wherein random variation amounts of individual circuit elemental devices forming the gate circuit are also root-mean-squared.

5. The timing analysis method as set forth in claim 1, wherein the random variation amount is a process variation.

6. The timing analysis method as set forth in claim 1, wherein if the timing analysis is carried out in a slowest operating condition:
   (i) for a setup operation of a candidate signal against a reference signal, the most severe operating condition is a condition as a result of shifting the delay distribution of the reference signal in the direction of condition severization; and
   (ii) for a hold operation of the candidate signal against the reference signal, the most severe operating condition is a condition as a result of shifting the delay distribution of the candidate signal in the direction of condition severization.

7. The timing analysis method as set forth in claim 6, wherein the direction of the condition severization is a condition in which the power supply voltage is shifted in the direction of higher voltage and/or the operating temperature is shifted in the direction of lower temperature.

8. The timing analysis method as set forth in claim 6, wherein the most severe variation amount obtaining step (c) includes:
   (c') arithmetically calculating a variation amount for a setup time and/or a hold time by (i) a shift amount of the delay distribution of one of the signals shifted in the condition severization direction and (ii) a root-mean-square value between the random variation amount of the one signal with the addition of the delay distribution shift and the random variation amount of the other signal.

9. The timing analysis method as set forth in claim 8, wherein of the most severe variation coefficients:
   the most severe variation coefficient for the one signal is a coefficient that is found by subtraction of the random variation amount of the other signal from the most severe variation amount and then by division by the delay value of the one signal; and the most severe variation amount for the other signal is a coefficient that is found by division of the random variation amount of the other signal by the delay value of the other signal.

10. The timing analysis method as set forth in claim 1, wherein if the timing analysis is carried out in a fastest operating condition:
   (i) for a setup operation of a candidate signal against a reference signal, the most severe operating condition is a condition as a result of shifting the delay distribution of the candidate signal in the direction of condition severization; and
   (ii) for a hold operation of the candidate signal against the reference signal, the most severe operating condition is a condition as a result of shifting the delay distribution of the reference signal in the direction of condition severization.

11. The timing analysis method as set forth in claim 10, wherein the direction of the condition severization is a condition in which the power supply voltage is shifted in the direction of lower voltage and/or the operating temperature is shifted in the direction of higher temperature.

12. The timing analysis method as set forth in claim 10, wherein the most severe variation amount obtaining step (c) includes:
   (c') arithmetically calculating a variation amount for a setup time and/or a hold time by (i) a shift amount of the delay distribution of one of the signals shifted in the condition severization direction and (ii) a root-mean-square value between the random variation amount of the one signal with the addition of the delay distribution shift and the random variation amount of the other signal.

13. The timing analysis method as set forth in claim 1, wherein in the allocation of the individual variation coefficients:
   in a setup operation of a candidate signal against a reference signal, the most severe variation coefficient of the reference signal is allocated as a minimum coefficient while, on the other hand, the most severe variation coefficient of the candidate signal is allocated as a maximum coefficient; and
   in a hold operation of the candidate signal against the reference signal, the most severe variation coefficient of the candidate signal is allocated as a minimum coefficient while, on the other hand, the most severe variation coefficient of the reference signal is allocated as a maximum coefficient.

14. The timing analysis method as set forth in claim 13, wherein the individual variation coefficient of the gate circuit common between a plurality of the signal paths is that the minimum value of the minimum coefficients allocated for each of the signal paths becomes a minimum coefficient and the maximum value of the maximum coefficients allocated for each of the signal paths becomes a maximum coefficient.

15. A computer readable medium having a program for a verification of the propagation timing of two signals between signal paths, the program controlling a computer to execute:
   (a) obtaining a delay value of a signal propagating through a signal path selected as a candidate for timing analysis;
   (b) obtaining a random variation amount of the delay value through the signal path, which is a root-mean-square value of variation amounts of gate circuit stages forming the signal path based on a statistical property of additivity of variance;
   (c) obtaining, based on the delay value and the random variation amount, a most severe variation amount between the two signals in a most severe operating condition;
   (d) obtaining a respective most severe variation coefficient for each of the signals by allocation of the most severe variation amount to the two signals according to the most severe operating condition;
   (e) allocating, based on the most severe variation coefficient, a respective individual variation coefficient for each of the gate circuits; and
   (f) performing, based on the individual variation coefficient, a timing analysis,
   wherein the most severe operating condition is a condition that allowable degree of a set-up property and/or a hold property decreases due to a power source voltage and/or an operating temperature under a slowest operating condition and/or a fastest operating condition of the set-up property and/or the hold property, and
   wherein the most severe variation amount is a variation amount obtained under the most severe operating condition.

16. A timing analysis tool to perform a verification of the propagation timing of two signals between signal paths, comprising:
   (a) a delay arithmetic unit for obtaining a delay value of a signal propagating through a signal path selected as a candidate for timing analysis;
   (b) a random variation arithmetic unit for obtaining a random variation amount of the delay value through the signal path, which is a root-mean-square value of variation amounts of gate circuit stages forming the signal path based on a statistical property of additivity of variance;
   (c) a most severe variation amount arithmetic unit for obtaining, based on the delay value and the random variation amount, a most severe variation amount between the two signals in a most severe operating condition;
   (d) a most severe variation coefficient arithmetic unit for obtaining a respective most severe variation coefficient for each of the signals by allocation of the most severe variation amount to the two signals according to the most severe operating condition;
   (e) an individual variation coefficient allocation unit for allocating, based on the most severe variation coefficient, an individual variation coefficient for each of the gate circuits; and
   (f) an analysis unit for performing, based on the individual variation coefficient, a timing analysis,
   wherein the most severe operating condition is a condition that allowable degree of a set-up property and/or a hold property decreases due to a power source voltage and/or an operating temperature under a slowest operating condition and/or a fastest operating condition of the set-up property and/or the hold property, and
   wherein the most severe variation amount is a variation amount obtained under the most severe operating condition.

* * * * *

UNITED STATES PATENT AND TRADEMARK OFFICE
CERTIFICATE OF CORRECTION

PATENT NO. : 7,669,154 B2  Page 1 of 1
APPLICATION NO. : 11/206814
DATED : February 23, 2010
INVENTOR(S) : Toshikatsu Hosono It is certified that error appears in the above-identified patent and that said Letters Patent is hereby corrected as shown below:

Column 18, Lines 6-7, after "variation coefficient," insert --a timing analysis,--.

Column 18, Line 50, change "step" to --operation--.

Column 19, Line 24, change "step" to --operation--.

Signed and Sealed this

Eighteenth Day of May, 2010

David J. Kappos
*Director of the United States Patent and Trademark Office*